United States Patent
Choi

(10) Patent No.: US 6,667,186 B2
(45) Date of Patent: Dec. 23, 2003

(54) METHOD OF ISOLATING SEMICONDUCTOR LASER DIODE

(75) Inventor: Kwang-ki Choi, Kyungki-do (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 4 days.

(21) Appl. No.: 10/259,325

(22) Filed: Sep. 30, 2002

(65) Prior Publication Data

US 2003/0113977 A1 Jun. 19, 2003

(30) Foreign Application Priority Data

Dec. 17, 2001 (KR) ........................................ 2001-80015

(51) Int. Cl.[7] .............................................. H01L 21/00
(52) U.S. Cl. ......................................... 438/33; 438/462
(58) Field of Search .............................. 257/79, 82, 94, 257/103, 183, 189, 200; 372/45; 438/22, 24, 31–35, 42–47, 110, 113, 114, 116, 400, 412, 414, 458, 460–465, 478, 479, 481, 483, 572, 604, 606, 978

(56) References Cited

U.S. PATENT DOCUMENTS 5,994,205 A * 11/1999 Yamamoto et al. ......... 438/464
6,033,927 A * 3/2000 Shibata et al. ................ 438/33
6,518,079 B2 * 2/2003 Imler ........................... 438/33
2002/0159492 A1 * 10/2002 Yamamura et al. ........... 372/46

* cited by examiner

Primary Examiner—Kamand Cuneo
Assistant Examiner—Asok Kumar Sarkar

(57) ABSTRACT

A method of isolating semiconductor laser diodes is provided. A n-type compound semiconductor layer is formed on a substrate. A plurality of semiconductor laser diodes having the n-type compound semiconductor layer are formed on the n-type compound semiconductor layer so that laser emitting regions of the semiconductor laser diodes are connected to each other. The n-type compound semiconductor layer and a material layer of which the semiconductor laser diodes are formed are removed around the semiconductor laser diodes and the laser emitting regions for connecting the semiconductor laser diodes to each other. Base cut lines that perpendicularly cross the laser emitting regions are formed on backside of the substrate between the semiconductor laser diodes. The semiconductor laser diodes are isolated from each other along the respective base cut lines. Thus, laser emitting faces perpendicular to an active layer and having clear surfaces can be obtained. Also, failure can be minimized in a process of isolating semiconductor laser diodes.

16 Claims, 7 Drawing Sheets

METHOD OF ISOLATING SEMICONDUCTOR LASER DIODE

CROSS-REFERENCE TO RELATED APPLICATIONS

This application is based upon and claims priority from Korean Patent Application No. 2001-0080015 filed Dec. 17, 2001, the contents of which are incorporated herein by reference.

BACKGROUND OF THE INVENTION

1. Field of the Invention

The present invention relates to a method of manufacturing semiconductor laser diodes, and more particularly, to a method of isolating semiconductor laser diodes by which laser emitting faces that are perpendicular to laser oscillation layers and have clear surfaces can be secured.

2. Description of the Related Art

A demand for semiconductor light-emitting diodes (LEDs) that emit light in the visible spectrum has increased with an increase in the necessity of high density information writing. As a result, semiconductor laser diodes (hereinafter, referred to as "LD") of various types which emit lasers in the visible spectrum have appeared. Among them, a nitride semiconductor LD of an III-V group has attracted special attention because of its direct transfer method where a probability of a laser oscillation is high and its possible blue laser oscillation.

In general, to manufacture a semiconductor LD having a low threshold voltage and high power, the semiconductor LD has to be cut so that a laser emitting face of the semiconductor LD is perpendicular to an oscillation layer and has a clear surface.

In a process of cutting the semiconductor LD, the luminance of a laser is largely deteriorated and the laser scatters on the laser emitting face if the laser emitting face is not perpendicular to the oscillation layer and has a rough surface. In this case, both critical current and critical voltage of the semiconductor LD increase.

A method of isolating a semiconductor LD, which is related to the above-described cutting of the semiconductor LD, according to the prior art will be described with reference to FIGS. 1 and 2.

An n-type GaN-based compound semiconductor layer 4, a GaN-based active layer 6 from which a laser is generated, and a p-type GaN-based compound semiconductor layer 8 are sequentially formed on a sapphire substrate 2. A predetermined etching process forms a plurality of semiconductor LDs each having a ridge region 10 where p-type electrodes 16 are formed, a support 12, and an n-type electrode portion 14 where p-type electrodes 16 and an n-type electrodes 18 are formed. A base cut line necessary for isolating the semiconductor LDs is scribed on a portion of the bottom surface of the sapphire substrate 2. More precisely, the base cut line is scribed along a potential division line L for dividing the semiconductor LDs using a diamond tip. A semiconductor LD 22 having a laser emitting face 20 as shown in FIG. 2 is formed by applying pressure on the ridge region 10 over the potential division line L using a ceramic knife.

In the method of isolating the semiconductor LD according to the prior art, a step between an N electrode and a P electrode is high, and pressure has to be applied on the ridge region 10 over the potential division line L to cut a thick n-type compound semiconductor layer, an active layer from which a laser is emitted, and a p-type compound semiconductor layer. In this case, a laser emitting face is not formed along a major plane of the sapphire substrate, but the compound semiconductor layer is frequently cut along a major plane of the compound semiconductor layer formed on the sapphire substrate.

When the semiconductor LD on the sapphire substrate is cut along a crystal plane different from the major plane of the sapphire substrate, the length of an oscillator is changed and the laser emitting face is not perpendicular to a direction along which a laser has to be emitted. As a result, the emitting of laser deteriorates, and yield of a process of isolating the semiconductor LD reduces with a reduction in the reproduction rate of the semiconductor LD.

SUMMARY OF THE INVENTION

To solve the above-described problems, it is an object of the present invention to provide a method of isolating semiconductor LDs by which the semiconductor LDs can be cut by applying a small force, laser emitting faces that are perpendicular to directions along which lasers are emitted and have clear surfaces can be obtained, and the reproduction rate of the semiconductor LDs can be increased.

Accordingly, to achieve the above object, there is provided a method of isolating semiconductor laser diodes. A n-type compound semiconductor layer is formed on a substrate. A plurality of semiconductor laser diodes having the n-type compound semiconductor layer are formed on the n-type compound semiconductor layer so that laser emitting regions of the semiconductor laser diodes are connected to each other. The n-type compound semiconductor layer and a material layer of which the semiconductor laser diodes are formed are removed around the semiconductor laser diodes and the laser emitting regions for connecting the semiconductor laser diodes to each other. Base cut lines that perpendicularly cross the laser emitting regions are formed on backside of the substrate between the semiconductor laser diodes. The semiconductor laser diodes are isolated from each other along the respective base cut lines.

When forming the plurality of semiconductor laser diodes, a plurality of semiconductor laser diodes including a ridge portion having a stripe shape on the n-type compound semiconductor layer in the directions along which lasers are emitted and a p-type compound semiconductor layer having p-type electrodes on ridge parts of the ridge portion are formed.

When forming the plurality of semiconductor laser diodes, a plurality of semiconductor laser diodes having n-type electrodes on predetermined regions of the n-type compound semiconductor layer adjacent to the ridge portion are formed.

When forming the plurality of semiconductor laser diodes, a plurality of semiconductor laser diodes having supports for relieving stress occurring when the semiconductor laser diodes are packaged are formed on predetermined regions spaced apart from the ridge portion of the p-type compound semiconductor layer.

The active layer is an $In_xAl_yGa_{1-x-y}N$ layer, where $0 \leq x \leq 1$, $0 \leq y \leq 1$ and $x+y \leq 1$ or an $In_xAl_yGa_{1-x-y}N$ layer having a multi quantum well structure.

When removing the n-type compound semiconductor layer and the material layer of which the semiconductor laser diodes are formed, first, a mask, which covers the plurality of semiconductor laser diodes and portions for connecting the plurality of semiconductor laser diodes to each other in the directions along which the lasers are emitted, is formed on the resultant structure obtained from the formation of the plurality of the semiconductor laser diodes. Next, the resultant structure on which the mask is formed is etched until the substrate is exposed, and then the mask is removed.

Using the present invention, a laser emitting faces of the semiconductor LDs, which are perpendicular to directions along which laser are emitted and have clear surfaces, can be obtained. As a result, reproduction rate of semiconductor LDs are increased, which considerably reduces frequency of cutting the laser emitting faces of the semiconductor LDs in opposite directions to the cut face of the substrate in a repetitive process of isolating the semiconductor LDs. In other words, failure can be minimized in the process of the isolating the semiconductor LDs.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

Hereinafter, a method of isolating semiconductor LDs according to embodiments of the present invention will be described with reference to the attached drawings. In drawings, the thicknesses of layers or regions are exaggerated for clarity.

Figure 1:
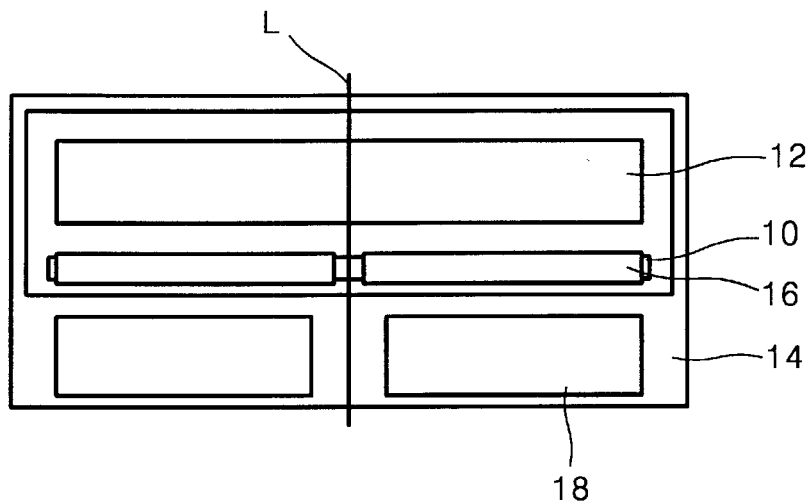
FIG. 1 is a plan view of a semiconductor LD explaining a method of isolating the semiconductor LD according to the prior art.
Figure 2:
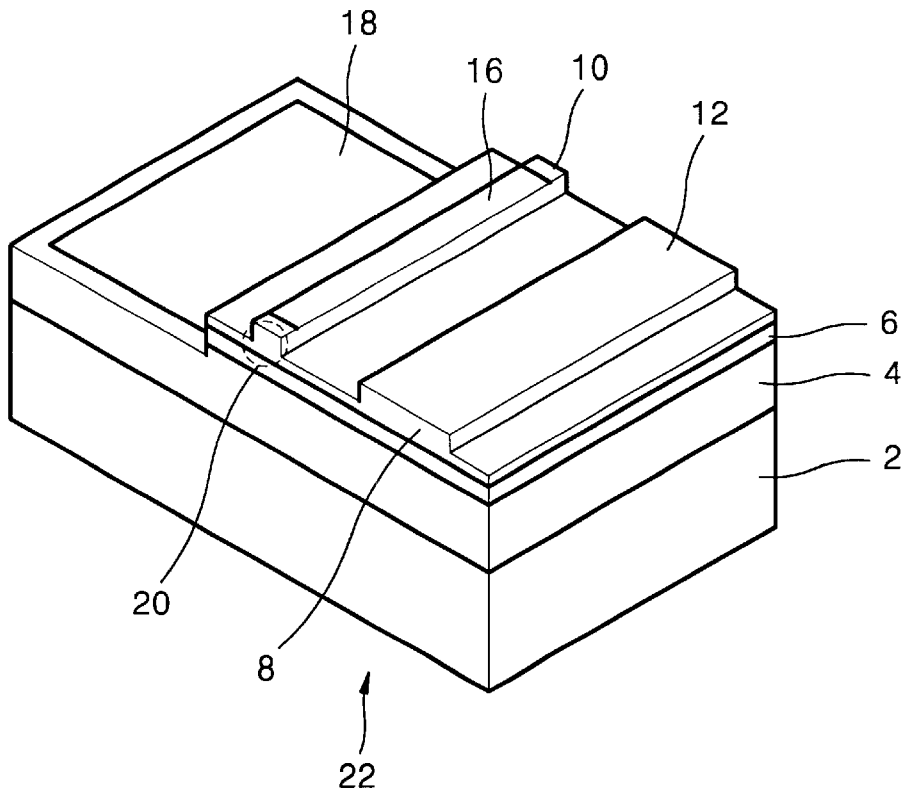
FIG. 2 is a perspective view of the semiconductor LD explaining the method of isolating the semiconductor LD according to the prior art.
Figure 3:
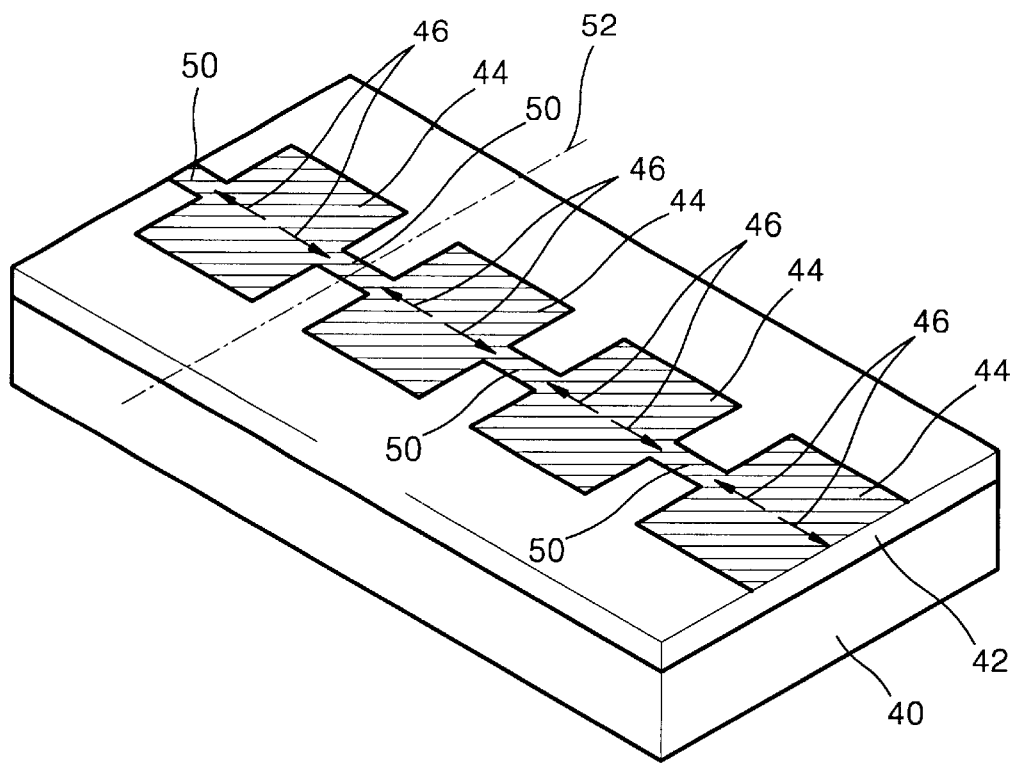
FIGS. 3 through 7 are perspective views sequentially explaining a basic concept for a method of isolating semiconductor LDs according to the present invention.

FIGS. 3 through 7 are perspective views explaining steps of a method of isolating semiconductor LDs according to the present invention. Referring to FIG. 3, an n-type compound semiconductor layer 42 is formed on a substrate 40. A plurality of semiconductor LDs 44, each of which is composed of the n-type compound semiconductor layer 42, an n-type electrode, a laser oscillation layer, and a p-type electrode are formed on the n-type compound semiconductor layer 42. Laser emitting portions of the semiconductor LDs 44, more particularly, laser oscillation regions, are connected to each other in directions 46 along which lasers are emitted. Here, it is preferable that connectors 50 for connecting adjacent semiconductor LDs 44 to each other are formed to be perpendicular to a major plane of the substrate 40, if possible. For convenience, a potential line 52 perpendicularlly crossing the connectors 50 is regarded as defining the major plane of the substrate 40.

Figure 4:
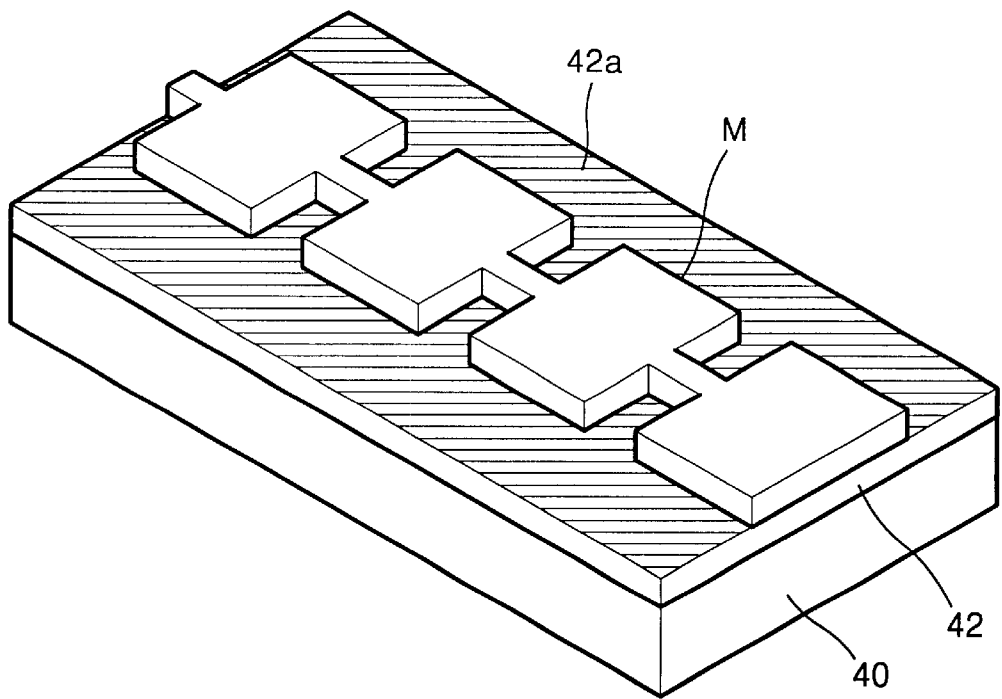

The semiconductor LDs 44 and the connectors 50 are covered with a mask pattern M, as shown in FIG. 4. An exposed portion 42a of the n-type compound semiconductor layer 42 is etched using the mask pattern M as an etch mask until the substrate 40 is exposed. It is preferable that the etching is an anisotropic dry etching. The mask pattern M is removed.

Figure 5:
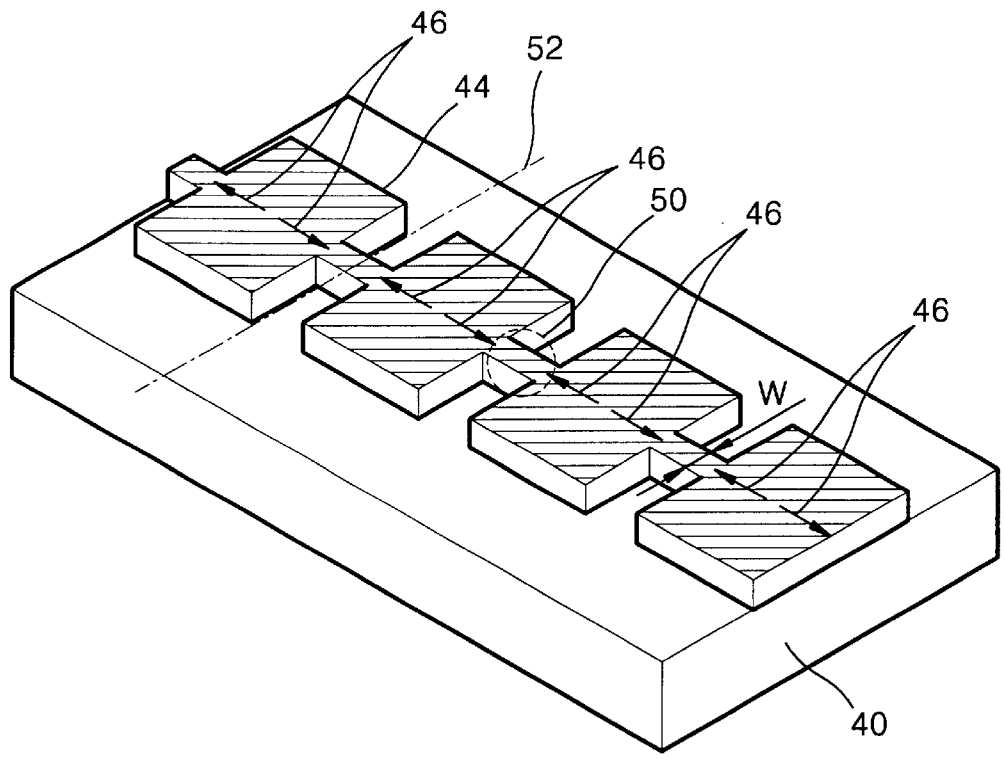

As a result, as shown in FIG. 5, only the plurality of semiconductor LDs 44 and the connectors 50 remain on the substrate 40.

Figure 6:
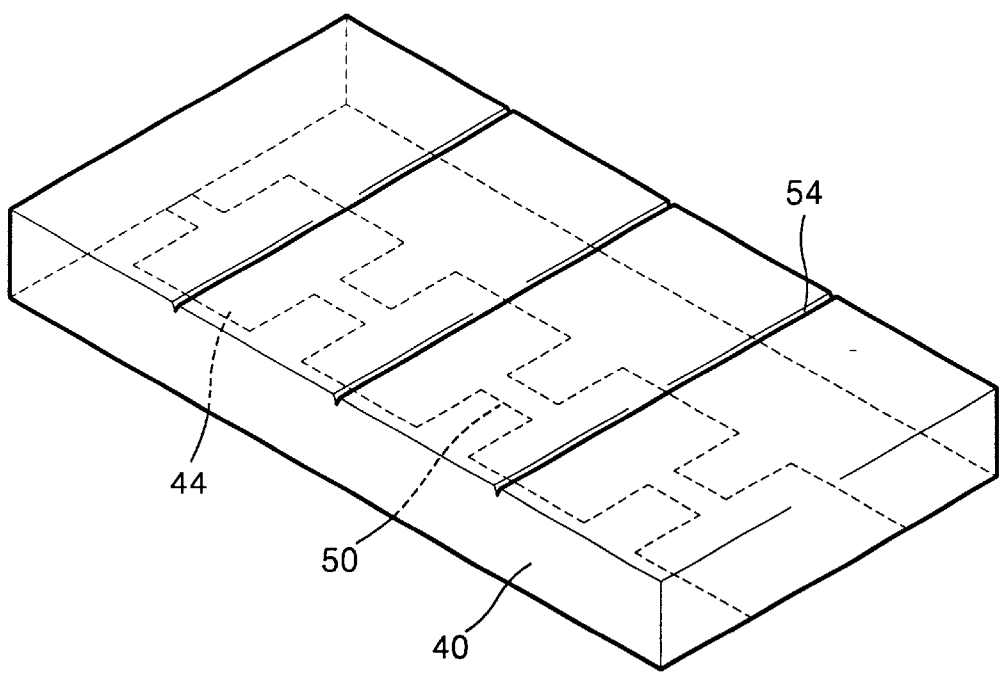

As shown in FIG. 6, base cut lines 54 are formed using a diamond tip on the bottom surface of the substrate 40 to be perpendicular to the connectors 50 and cross the semiconductor LDs 44.

Figure 7:
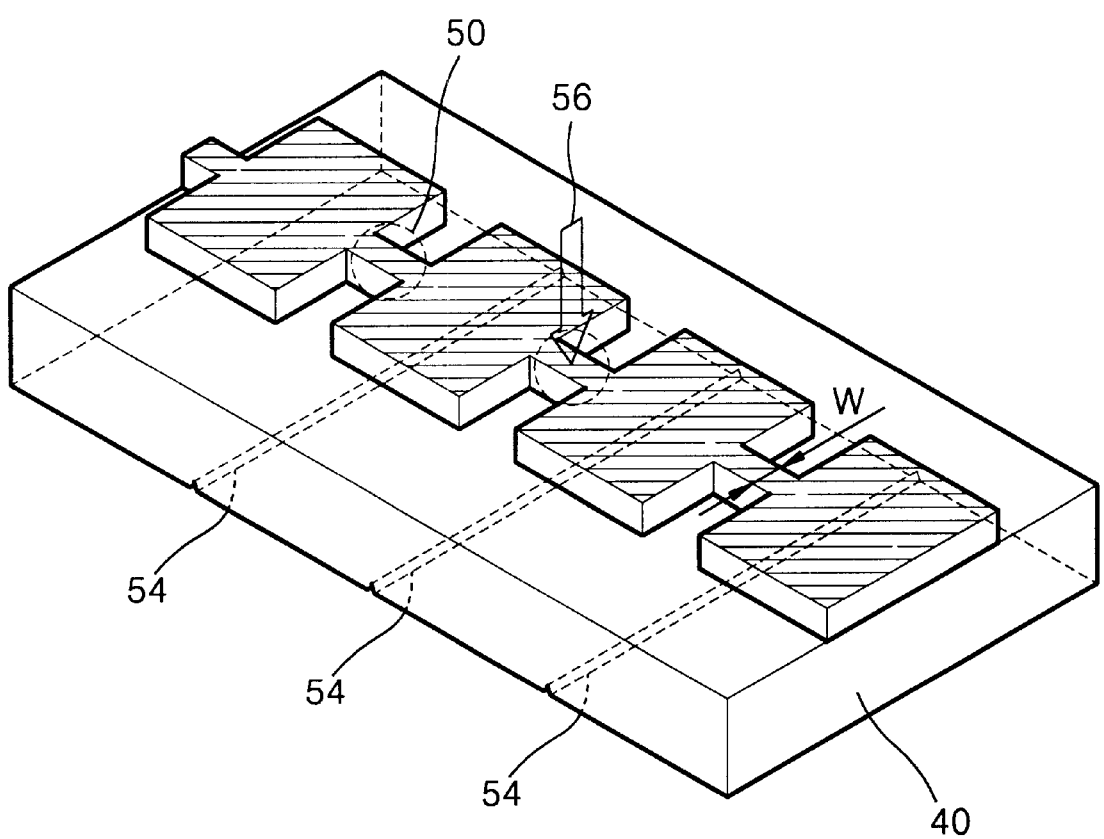

As shown in FIG. 7, adjacent semiconductor LDs 44 are isolated from each other by applying a predetermined force 56 on lines in the areas of the connectors 50 opposite to the base cut lines 54. Here, a thickness of connectors 50 is much thinner that that of the substrate 40, and a width W of the connectors 50 becomes much narrower than that of the substrate 40 due to the etching. Thus, the semiconductor LDs 44 can be isolated from each other even by applying a small force, the connectors 50 of the n-type compound semiconductor layer 42 are cut in the same direction as the major plane 52 of the substrate 40. As a result, directions of cut surfaces of the semiconductor LDs 44, i.e., directions of laser emitting faces through which lasers are emitted, are identical to the major plane 52 of the substrate 40. Semiconductor LDs having laser emitting faces that are perpendicular along directions to which lasers are emitted and have clear surfaces can be obtained from these processes.

A method of isolating a ridge type semiconductor LD to which the above-described method of isolating semiconductor LDs is applied will be described.

Figure 8:
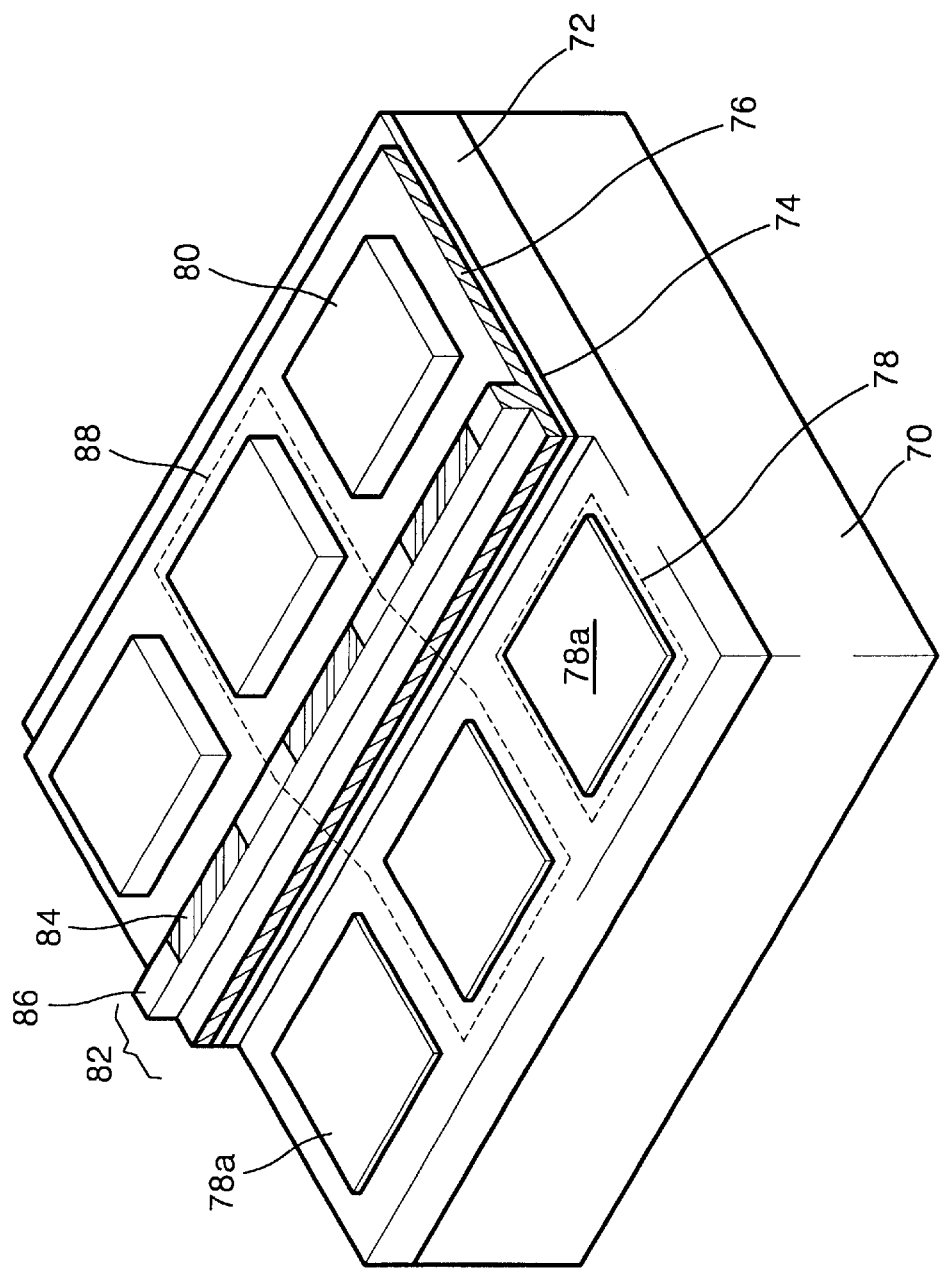
FIGS. 8 through 10 are a perspective view (FIG. 8) and plan views (FIGS. 9 and 10), respectively, explaining steps of the method of isolating semiconductor LDs according to an embodiment of the present invention using the basic concept of FIGS. 3 through 7.
Figure 9:
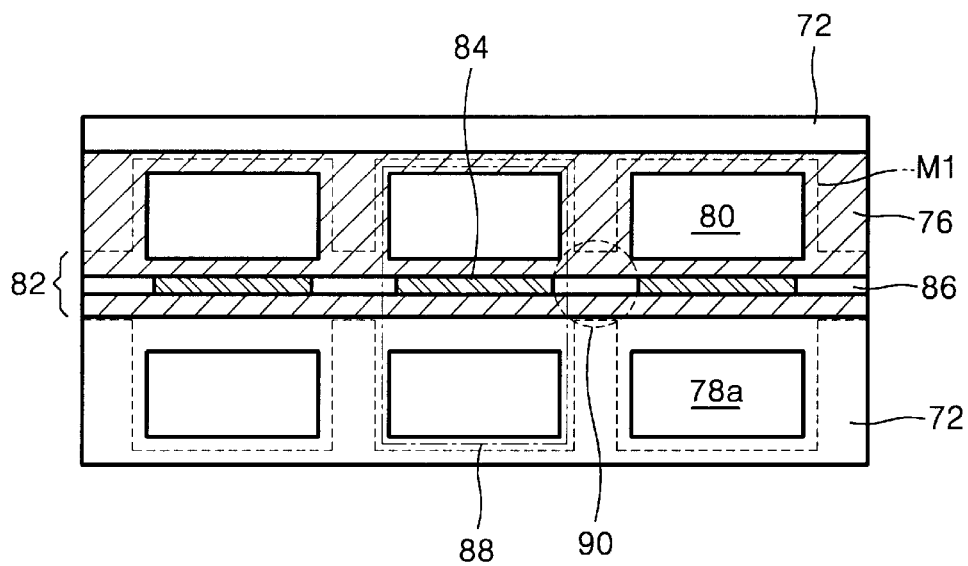
Figure 10:
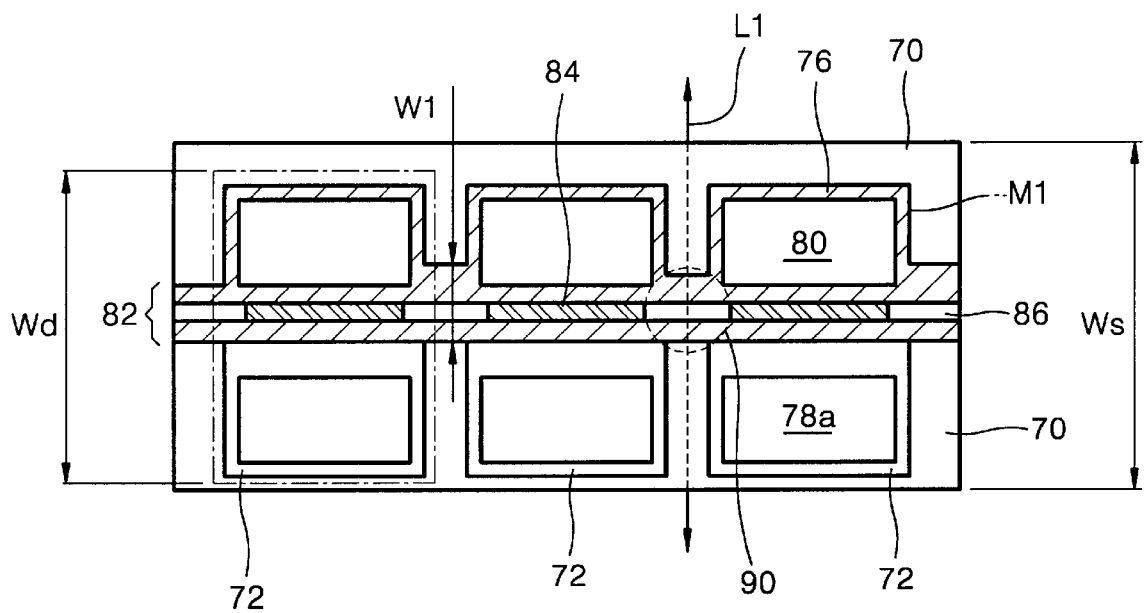

FIGS. 8 through 10 are a perspective view and plan views, respectively, explaining steps of a method of isolating a semiconductor LD having a ridge portion thereon. Referring to FIG. 8, an n-type GaN-based compound semiconductor layer 72, a GaN-based active layer 74 from which a laser is emitted, and a p-type GaN-based compound semiconductor layer 76 are sequentially formed on a substrate 70. It is preferable that the substrate 70 is formed of sapphire. The n-type and p-type GaN-based compound semiconductor layers 72 and 76 are formed of a GaN-based III-V nitride semiconductor. A predetermined etching process removes a portion of the p-type GaN-based compound semiconductor layer 76. A portion of the GaN active layer 74 which is exposed due the removal of the portion of the p-type GaN-based compound semiconductor layer 76 is then removed. A portion of the n-type GaN-based compound semiconductor layer 72 underneath the portion of the GaN active layer 74 is also removed to a predetermined thickness. As a result, a predetermined step is formed between the p-type GaN-based compound semiconductor layer 76 and the exposed portion of the n-type GaN-based compound semiconductor layer 72. A ridge portion 82 on which p-type electrodes are formed and supports 80 are formed on the p-type GaN-based compound semiconductor layer 76. An n-type electrode portion 78 is formed on the exposed region of the n-type GaN compound semiconductor layer 76. As a result, a plurality of semiconductor LDs 88 having the ridge portion 82 thereon are formed on the substrate 70. Here, it is preferable that the ridge portion 82 has a stripe shape so that it is connected to a ridge portion of an adjacent semiconductor LD. It is preferable that the supports 80, which relieve stress that is applied to the ridge portion 82 when the semiconductor LDs 88 are cut and packaged, are formed to the same depth as a ridge part 86 of the ridge portion 82. Also, the GaN active layer 74 that is a laser oscillation layer is formed of a GaN-based III-V nitride semiconductor, e.g., $In_XAl_YGa_{1-X-Y}N$ ($0 \leq x \leq 1$, $0 \leq y \leq 1$ and $x+y \leq 1$). Here, the GaN active layer 74 may be a single layer of $In_XAl_YGa_{1-X-Y}N$ or may have a multi quantum well (MQW) structure.

The semiconductor LDs 88 have only minimum components in this embodiment. However, a waveguide layer formed of a GaN compound semiconductor layer and a clad layer may further be formed between the GaN active layer 74 and the n-type or p-type GaN-based compound semiconductor layer 72 and 76, respectively. Thereafter, p-type electrodes 84 and n-type electrodes 78a are formed on the ridge portion 82 and the n-type electrode portion 78, respectively.

Referring to FIG. 9, a mask pattern M1, which covers the plurality of semiconductor LDs 88 and connectors 90 for connecting the semiconductor LDs 88 and exposes other portions, is formed on the substrate 70. The exposed portions are anisotropically dry etched using the mask pattern M1 as an etch mask until the substrate 70 is exposed. It is preferable that the anisotropic dry etching is inductively coupled plasma-reactive ion etching (ICP-RIE). Then, the mask pattern M1 is removed.

As shown in FIG. 10, the anisotropic dry etching removes the n-type and p-type compound semiconductor layers 72 and 76 and the GaN active layer 74 around the semiconductor LDs 88 and the connectors 90. Thus, only the semiconductor LDs 88 and the connectors 90 remain on the substrate 70.

Referring to FIG. 10, it can be seen that a width W1 of the connector 90 is much narrower than a width Ws of the substrate 70 or a width Wd of the semiconductor LD 88. Thus, it is obvious that a width of a portion that is formed under the connectors 90 of the n-type and p-type semiconductor laser layers 72 and 76 is also much narrower than the width Ws of the substrate 70 or the width Wd of the semiconductor LD 88.

Before cutting the semiconductor LDs88 to be isolated from each other, base cut lines L1 crossing the connector 90 are formed on the backside of the substrate 70 between the semiconductor LDs 88 to easily cut the semiconductor LDs 88. The base cut lines L1 are formed by scribing the bottom surface of the substrate 70 using a diamond tip. The base cut lines L1 are formed between the semiconductor LDs 88.

A predetermined force is applied to portions that are opposite to the base cut lines L1 using a predetermined tool, e.g., a ceramic knife. The substrate 70 is cut along the base cut lines L1 by such force. Here, since the width W1 of the connector 90 is narrow and the thickness thereof is much narrower than that of the substrate 70, the connectors 90 are accurately cut along potential lines corresponding to the base cut lines L1. Cut faces of the connectors 90, which are perpendicular to directions along which lasers are emitted and have clear surfaces, serve as laser emitting faces of the semiconductor LDs 88.

Figure 11:
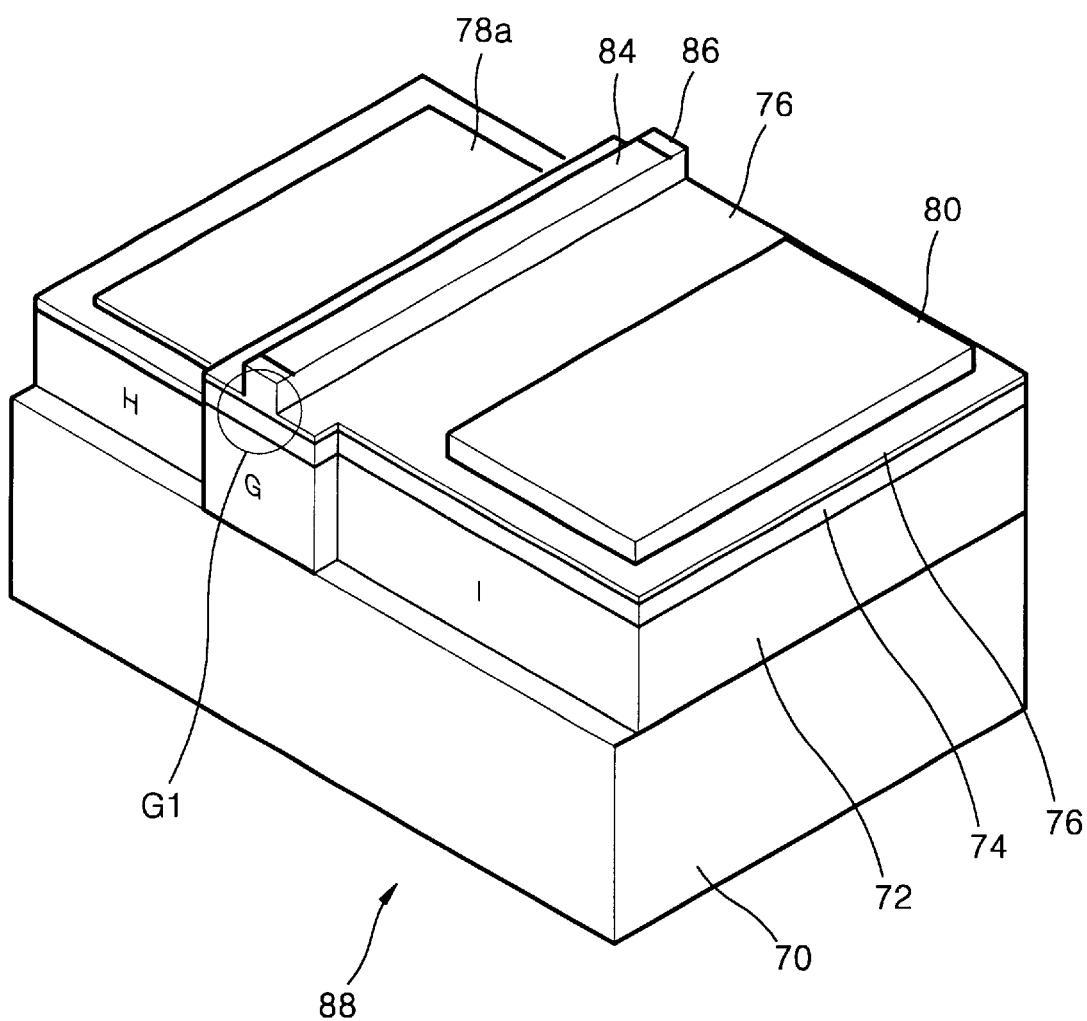
FIG. 11 is a perspective view of a ridge type semiconductor LD which is isolated according to the method of isolating a semiconductor LD according to the embodiment of the present invention.

FIG. 11 is a perspective view of a ridge type semiconductor LD isolated according to the above-described steps. Reference characters H and I represent faces that are exposed by etching, and reference character G represents a first cut face of the connector 90 that is exposed by cutting. Reference character G1 represents a portion of the first cut face G from which a laser is emitted. A second cut face, which is exposed in an opposite direction to the first cut face G, is coated with a dielectric layer as a reflective face.

When a plurality of semiconductor LDs formed on a substrate are isolated. from each other according to the above-described method of the present invention, the p-type GaN-based compound semiconductor layer 76, the GaN-based active layer 74, and the n-type GaN-based compound semiconductor layer 72 existing on base cut line L1 are defined by a ridge portion having a narrow width. Since a step between n-type and p-type electrodes is formed lower than in the prior art, laser emitting faces corresponding to the base cut lines L1 formed on the substrate, e.g., cleavage faces, are formed by applying a small force.

Many contents have been described in detail in the above explanation. However, they must be interpreted as preferred embodiments of the present invention rather than restricting the scope of the present invention. For example, one of ordinary skill in the art can apply the above-described method of isolating semiconductor LDs to a process of isolating semiconductor LDs of another shape not ridge shape, e.g., a process of isolating semiconductor LDs each having a n-type electrode element underneath a substrate or a thermal emitting element. Thus, the scope of the present invention must be defined by the appended claims not the above-described embodiments.

As described above, in a method of isolating semiconductor LDs according to the present invention, p-type and n-type compound semiconductor layers, and an active layer around the semiconductor LDs and connectors for connecting the semiconductor LDs to each other are removed before the semiconductor LDs are isolated from each other. As a result, the thickness of the n-type compound semiconductor layer is much thinner than that of a substrate and widths of cut portions of the n-type and p-type compound semiconductor layers and the active layer are much narrower than that of the substrate. Thus, a cut face of the substrate corresponds to cut faces of the n-type and p-type compound semiconductor layers and the active layer, i.e., laser emitting faces. This means that the laser emitting faces of the semiconductor LDs are perpendicular to directions along which laser are emitted and have clear surfaces. As a result, reproduction rate of semiconductor LDs are increased, which considerably reduces frequency of cutting the laser emitting faces of the semiconductor LDs in opposite directions to the cut face of the substrate in a repetitive process of isolating the semiconductor LDs. In other words, failure can be minimized in the process of the isolating the semiconductor LDs.

What is claimed is:

1. A method of isolating semiconductor laser diodes, the method comprising:

(a) forming a n-type compound semiconductor layer on a substrate;

(b) forming a plurality of semiconductor laser diodes on the n-type compound semiconductor layer so that laser emitting regions of the semiconductor laser diodes are connected to each other;

(c) removing the n-type compound semiconductor layer and a material layer of which the semiconductor laser diodes are formed, around the semiconductor laser diodes and the laser emitting regions for connecting the semiconductor laser diodes to each other;

(d) forming base cut lines that perpendicularly cross the laser emitting regions, on backside of the substrate between the semiconductor laser diodes; and (e) isolating the semiconductor laser diodes from each other along the respective base cut lines.

2. The method of claim 1, wherein step (b) further comprises forming a plurality of semiconductor laser diodes including a ridge portion having a stripe shape on the n-type compound semiconductor layer in the directions along which lasers are emitted and a p-type compound semiconductor layer having p-type electrodes on ridge parts of the ridge portion.

3. The method of claim 2, wherein step (b) further comprises forming a plurality of semiconductor laser diodes having n-type electrodes on predetermined regions of the n-type compound semiconductor layer adjacent to the ridge portion.

4. The method of claim 3, wherein step (b) further comprises forming a plurality of semiconductor laser diodes, having supports for relieving stress occurring when the semiconductor laser diodes are packaged, on predetermined regions spaced apart from the ridge portion of the p-type compound semiconductor layer.

5. The method of claim 3, wherein the p-type compound semiconductor layer is formed of a GaN-based III-V nitride semiconductor.

6. The method of claim 5, wherein the n-type compound semiconductor layer is formed of a GaN-based III-V nitride semiconductor.

7. The method of claim 2, wherein step (b) further comprises forming a plurality of semiconductor laser diodes, having supports for relieving stress occurring when the semiconductor laser diodes are packaged, on predetermined regions spaced apart from the ridge portion of the p-type compound semiconductor layer.

8. The method of claim 7, wherein the substrate is formed of sapphire.

9. The method of claim 2, wherein the p-type compound semiconductor layer is formed of a GaN-based III-V nitride semiconductor.

10. The method of claim 9, wherein the n-type compound semiconductor layer is formed of a GaN-based III-V nitride semiconductor.

11. The method of claim 10, wherein an active layer is formed of a GaN-based III-V nitride semiconductor underneath the p-type electrodes of the plurality of semiconductor laser diodes.

12. The method of claim 11, wherein the active layer is an $In_xAl_yGa_{1-X-Y}N$ layer, where $0 \leq x \leq 1$, $0 \leq y \leq 1$ and $x+y \leq 1$.

13. The method of claim 11, wherein the active layer is an $In_xAl_yGa_{1-X-Y}N$ layer having a multi quantum well structure, where $0 \leq x \leq 1$, $0 \leq y \leq 1$ and $x+y \leq 1$.

14. The method of claim 1, wherein the substrate is formed of sapphire.

15. The method of claim 1, wherein step (c) comprises:
forming a mask on the resultant structure obtained in step (b) which covers the plurality of semiconductor laser diodes and portions for connecting the plurality of semiconductor laser diodes to each other in the directions along which the lasers are emitted;
etching the resultant structure on which the mask is formed until the substrate is exposed; and
removing the mask.

16. The method of claim 15, wherein the resultant structure on which the mask is formed is etched by inductively coupled plasma-reactive ion etching.

* * * * *